United States Patent
Jin et al.

(10) Patent No.: US 9,496,339 B2
(45) Date of Patent: Nov. 15, 2016

(54) SEMICONDUCTOR DEVICE COMPRISING TRENCH STRUCTURES

(71) Applicant: Infineon Technologies Austria AG, Villach (AT)

(72) Inventors: Minghao Jin, Villach (AT); Rudolf Rothmaler, Villach (AT); Oliver Blank, Villach (AT); Joerg Ortner, Drobollach (AT)

(73) Assignee: Infineon Technologies Austria AG, Villach (AT)

( * ) Notice: Subject to any disclaimer, the term of this patent is extended or adjusted under 35 U.S.C. 154(b) by 23 days.

(21) Appl. No.: 14/293,479

(22) Filed: Jun. 2, 2014

(65) Prior Publication Data

US 2015/0349056 A1 Dec. 3, 2015

(51) Int. Cl.
*H01L 29/66* (2006.01)
*H01L 29/06* (2006.01)
*H01L 29/423* (2006.01)
*H01L 29/78* (2006.01)
*H01L 29/40* (2006.01)

(52) U.S. Cl.
CPC ....... *H01L 29/0696* (2013.01); *H01L 29/4236* (2013.01); *H01L 29/7811* (2013.01); *H01L 29/7813* (2013.01); *H01L 29/7827* (2013.01); *H01L 29/407* (2013.01)

(58) Field of Classification Search
CPC .............. H01L 21/76224; H01L 21/76232; H01L 29/7813
USPC ........................................ 257/330, 331, 332
See application file for complete search history.

(56) References Cited

U.S. PATENT DOCUMENTS

| 6,534,823 B2* | 3/2003 | Hueting | H01L 29/4236 257/330 |
| 2011/0101450 A1* | 5/2011 | Kim | H01L 27/10885 257/330 |
| 2013/0214290 A1 | 8/2013 | Hayashi et al. | |

OTHER PUBLICATIONS

Zundel, et al., "Semiconductor Device Including Trench Transistor Cell Array and Manufacturing Thereof," U.S. Appl. No. 13/886,305, filed May 3, 2013, pp. 1-24.

* cited by examiner

*Primary Examiner* — Tan N Tran
(74) *Attorney, Agent, or Firm* — Murphy, Bilak & Homiller, PLLC

(57) ABSTRACT

A semiconductor device includes a central portion and an edge termination portion outside the central portion. The central portion includes a transistor cell array in a semiconductor substrate. Components of transistor cells of the transistor cell array are disposed in adjacent trench structures in the semiconductor substrate. The trench structures run in a first linear direction parallel to a main surface of the semiconductor substrate. The trench structures include a plurality of concatenated trench segments in a plane parallel to the main surface in the central portion, at least one of the trench segments connecting a first point and a second point of one trench structure, the first point and the second point being arranged along the first linear direction. The trench segment comprises a portion extending in a direction different from the first direction.

20 Claims, 7 Drawing Sheets

SEMICONDUCTOR DEVICE COMPRISING TRENCH STRUCTURES

BACKGROUND

Power transistors are commonly employed in automotive and industrial electronics as switches. Generally, such transistors require a low on-state resistance ($R_{on}$), while securing a high voltage blocking capability. For example, a MOS (metal oxide semiconductor) power transistor should be capable—depending upon application requirements—to block drain to source voltages $V_{ds}$ of some tens to some hundreds or even thousands of volts. MOS power transistors typically conduct a very large current which may be up to some hundreds of Amperes at typically gate-source voltages of about 2 to 20 V.

In trench power devices, components of the transistors such as the gate electrode are typically disposed in trench structures formed in a main surface of a semiconductor substrate. Such trench power devices typically implement vertical transistors in which a current flow mainly takes place from a first side, e.g. a top surface of the semiconductor substrate to a second side, e.g. a bottom surface of the semiconductor substrate. When increasing trench depths for fulfilling requirements such as voltage blocking requirements, wafer bowing may occur which imposes severe limits on the processing of these power devices.

Hence, concepts of power transistors which avoid wafer bowing are sought for.

In view of the above, it is an object of the present invention to provide a semiconductor device and an integrated circuit having improved characteristics.

SUMMARY

The above objects are achieved by the claimed matter according to the independent claims.

According to an embodiment, a semiconductor device comprises a central portion and an edge termination portion outside the central portion. The central portion comprises a transistor cell array in a semiconductor substrate. Components of transistor cells of the transistor cell array are disposed in adjacent trench structures in the semiconductor substrate. The trench structures run in a first linear direction parallel to a main surface of the semiconductor substrate. The trench structures include a plurality of concatenated trench segments in a plane parallel to the main surface in the central portion, at least one of the trench segments connecting a first point and a second point of one trench structure, the first point and the second point being arranged along the first linear direction. The trench segment comprises a portion extending in a direction different from the first direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

Figure 1:
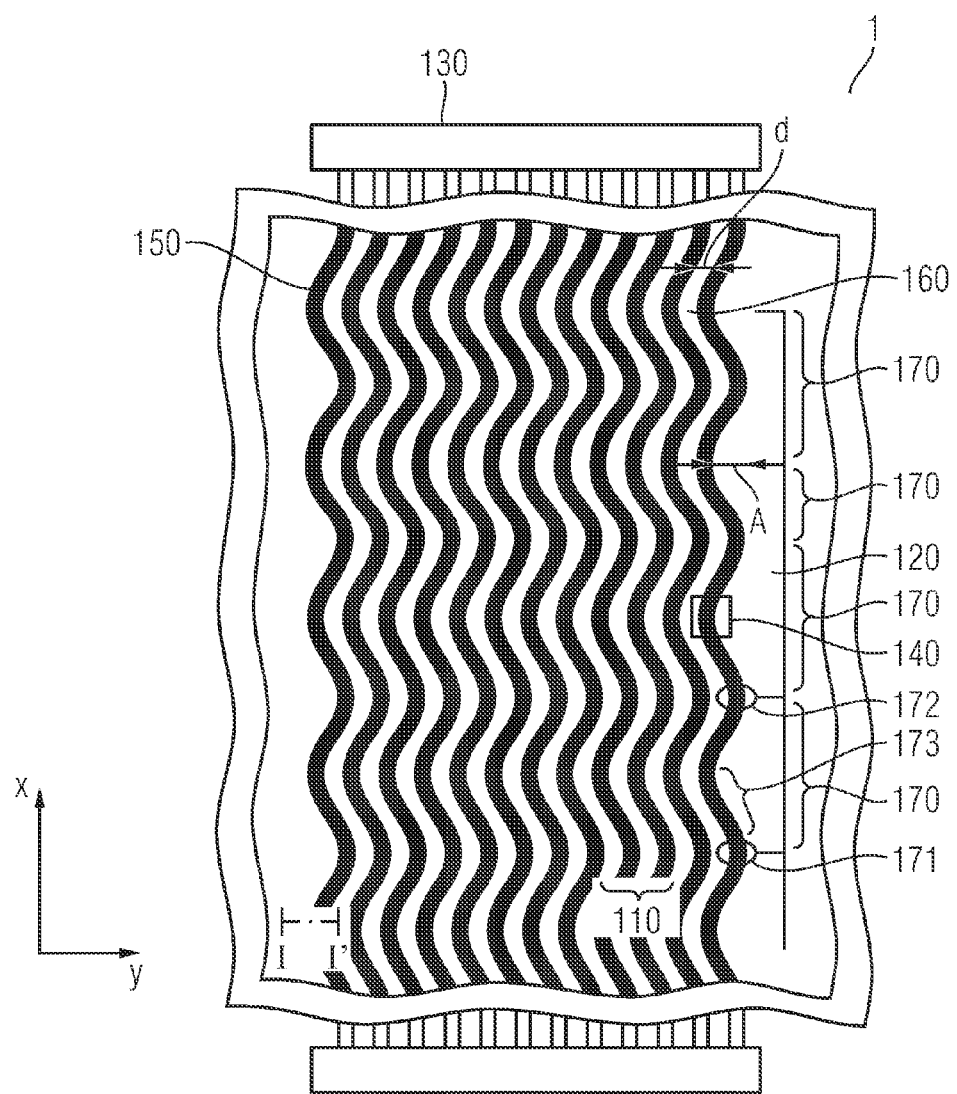
FIG. 1 shows a schematic plan view of a semiconductor device according to an embodiment.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be re-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending on whether the first conductivity type means n-type or p-type.

The terms "lateral" and "horizontal" as used in this specification intends to describe an orientation parallel to a main surface of a semiconductor substrate or semiconductor body. This can be for instance the top surface of a wafer or a die.

The term "vertical" as used in this specification intends to describe an orientation which is arranged perpendicular to the first surface of the semiconductor substrate or semiconductor body.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

FIG. 1 shows a plan view of a semiconductor device according to an embodiment. The semiconductor device comprises a central portion 120 and an edge termination portion 130 outside the central portion 120. The central portion 120 comprises a transistor cell array in a semiconductor substrate. The transistor cell array may comprise a plurality of single transistor cells 140. Components of the transistor cells may be connected in parallel. Components of the transistor cells 140 are disposed in adjacent trench structures 150 in the semiconductor substrate. The trench structures 150 generally run in a first linear direction that is parallel to a main surface of the semiconductor substrate 100. The trench structures 150 include a plurality of concatenated trench segments 170 in a plane parallel to the main surface in the central portion 120. At least one of the trench segments 170 connects a first point 171 and a second point 172 of one trench structure 150. The first point 171 and the second point 172 are arranged along the first linear direction (x-direction in the case of FIG. 1). The trench segment 170 comprises a portion 173 that extends in a direction different from the first direction.

According to an example, the edge termination portion 130 may surround the central portion 120. For example, the edge termination portion 130 may disposed along the outer periphery of a die. For example, adjacent trenches may be physically connected in this edge termination region 130.

According to an embodiment, the trench structures 150 may be disposed parallel to each other. For example, the semiconductor region disposed between adjacent trench structures 150 implements a mesa 160. According to an embodiment, a number of adjacent trench structures 150 may be 500 to 100000. A distance d between adjacent trench structures 150 may depend from the technology used. For example, a distance d may be several nanometers to approximately 100 µm, for example, 150 nm to 15 µm or 220 nm to 10 µm. However, as is to be clearly understood, different distances may be used. The trench structures 150 may have a width that depends from the technology used. For example, the trench structures may have a width that is larger than 100 nm. However, as is to be clearly understood, the minimum trench width may also be smaller. The distance and the width may be measured in a direction perpendicularly with respect to the first direction.

Figure 2A:
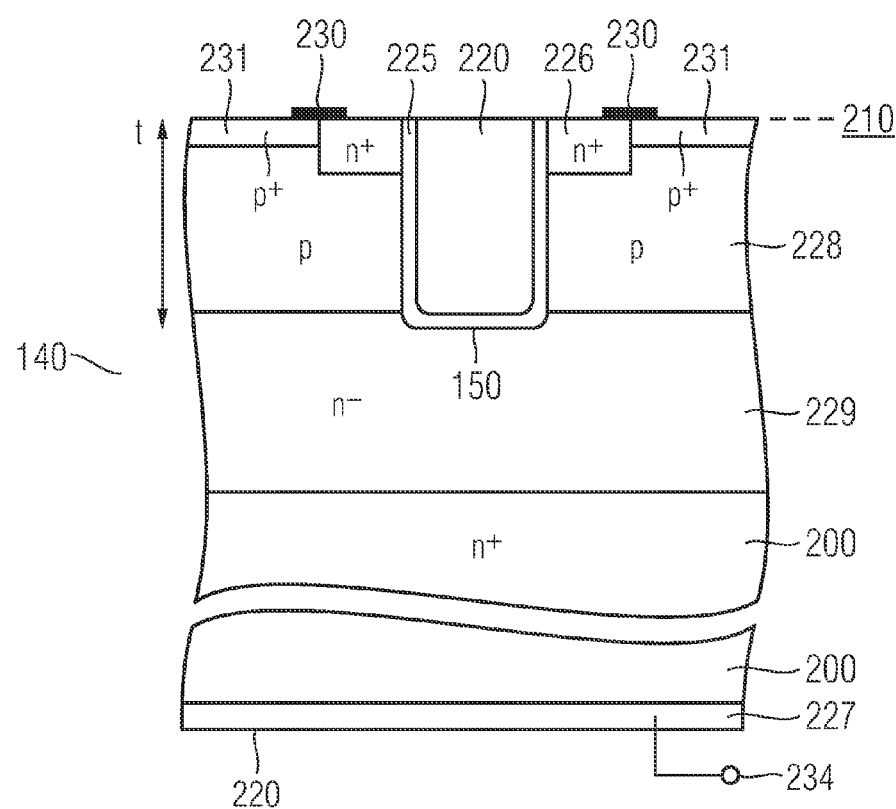
FIG. 2A shows a cross-sectional view of an example of a transistor cell of the semiconductor device shown in FIG. 1.

FIG. 2A shows a cross-sectional view of an example of a transistor cell 140 forming part of the transistor cell array 110. The cross-sectional view shown in FIG. 2A is e.g. taken between I and I' illustrated in FIG. 1, i.e. in a direction perpendicular with respect to a direction in which the respective portion of the trench segment extends. A trench structure 150 is formed in a main surface or top surface 210 of a semiconductor substrate 200. The trench structure 150 may extend to a depth t. For example, the trench structure 150 may extend to a depth of less than approximately 10 µm, e.g. 4 µm to 6.5 µm. A gate electrode 220 may be disposed in the trench structure 150, the gate electrode being insulated from adjacent substrate material by means of a gate dielectric 225. A source region 226 may be disposed adjacent to the trench structure 150 at the surface region of the semiconductor substrate 200. A body region 228 may be disposed adjacent to a portion of the gate electrode 220 in contact with the source region 226. A drift region 229 may be disposed beneath the body region 228 below the gate electrode 220. A drain region 227 may be disposed adjacent to a bottom side of the semiconductor substrate. A body contact region 231 may be disposed adjacent to the body region 228.

As illustrated in FIG. 2A, the body contact region 231 and the source electrode 226 may be connected via a contact 230 to a source terminal. The drain region 227 may be connected to a drain terminal 234.

According to the embodiment illustrated in FIG. 2A, the substrate 200 may be heavily n-doped, whereas the drift region is lightly n-doped. The body region and the body contact region may be p-doped, wherein the body contact region 231 is heavily p-doped. The source region 226 and the drain region 227 may be heavily n-doped. Nevertheless, as is clearly to be understood, opposite doping polarities may be applied.

In case of being switched on, a conductive inversion channel is formed at the boundary between the body region 228 and the gate dielectric 225. Accordingly, the transistor is in a conducting state from the source region 226 to the drain region 227 via the conductive inversion channel and the drift zone 229. In case of switching off, no conductive inversion channel is present and a current flow is suppressed. The transistor shown in FIG. 2A implements a vertical transistor in which a current flow mainly takes place between the top surface 210 and the bottom surface 211.

As is clearly to be understood, a transistor cell may also be implemented as an IGBT (insulated gate bipolar transistor), in which a doped region of the opposite conductivity type compared with the source region 226 is disposed adjacent to the bottom surface 220 of the substrate 200.

Figure 2B:
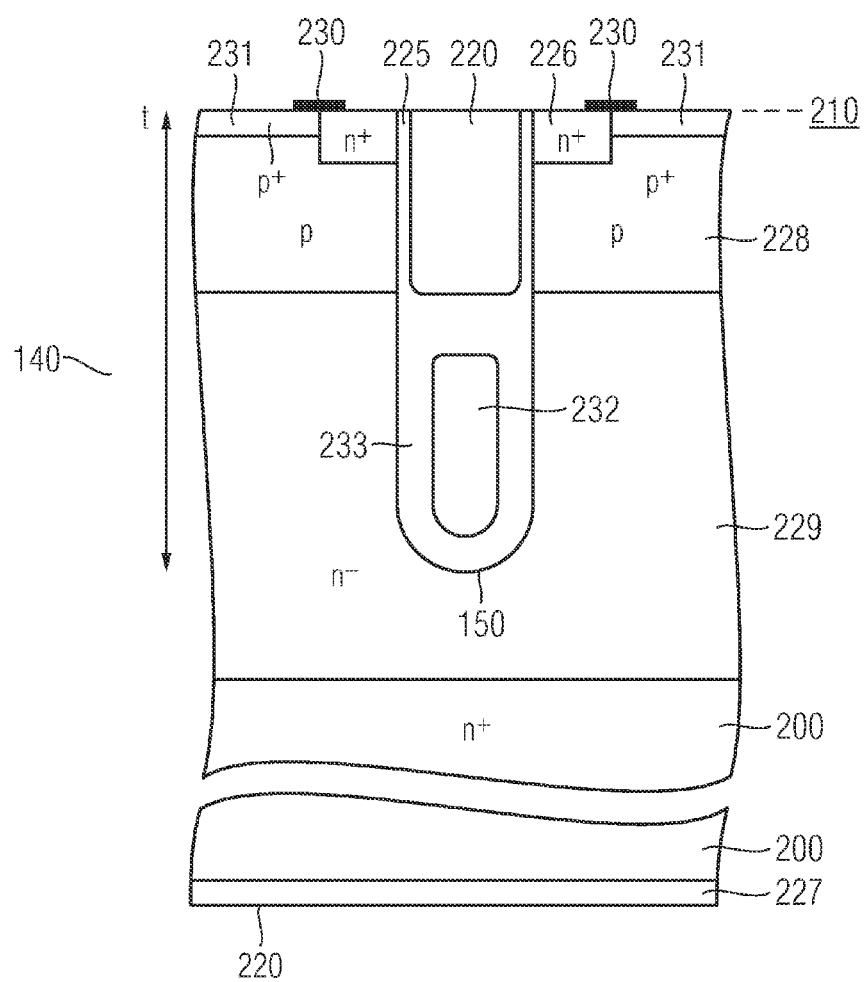
FIG. 2B shows a further cross-sectional view of an example of a transistor cell of the semiconductor device shown in FIG. 1.

FIG. 2B shows a cross-sectional view of a transistor cell 140 according to a further embodiment. In FIG. 2B the same components as those illustrated in FIG. 2A are designated with identical reference numerals. In addition to the structure shown in FIG. 2A, the transistor comprises a field plate 232 in a lower portion of the trench structure 150. The field plate 232 is disposed adjacent to the drift region 229. The field plate 232 is electrically insulated from the drift zone 229 by a field dielectric layer 233. For example, the field plate 232 may be connected to a source terminal. According to a further implementation, the field plate 232 may be coupled to the gate electrode 220.

As is clearly to be understood, the transistor cells 140 shown in FIGS. 2A and 2B merely represent examples of transistor cells that may be employed. As readily becomes apparent to the person skilled in the art, any further configuration and structure of the transistor cell may be employed, provided that at least a component of the transistor cell is disposed in a trench structure. According to an embodiment, an insulating layer or an insulating filling may be disposed in a portion of the trench structures 150. For example, the insulating layer or insulating filling may be implemented by the field dielectric layer 233 or the gate dielectric layer 225. According to an embodiment, the insulating layer or filling may have a thickness of more than 300 nm.

Figure 3:
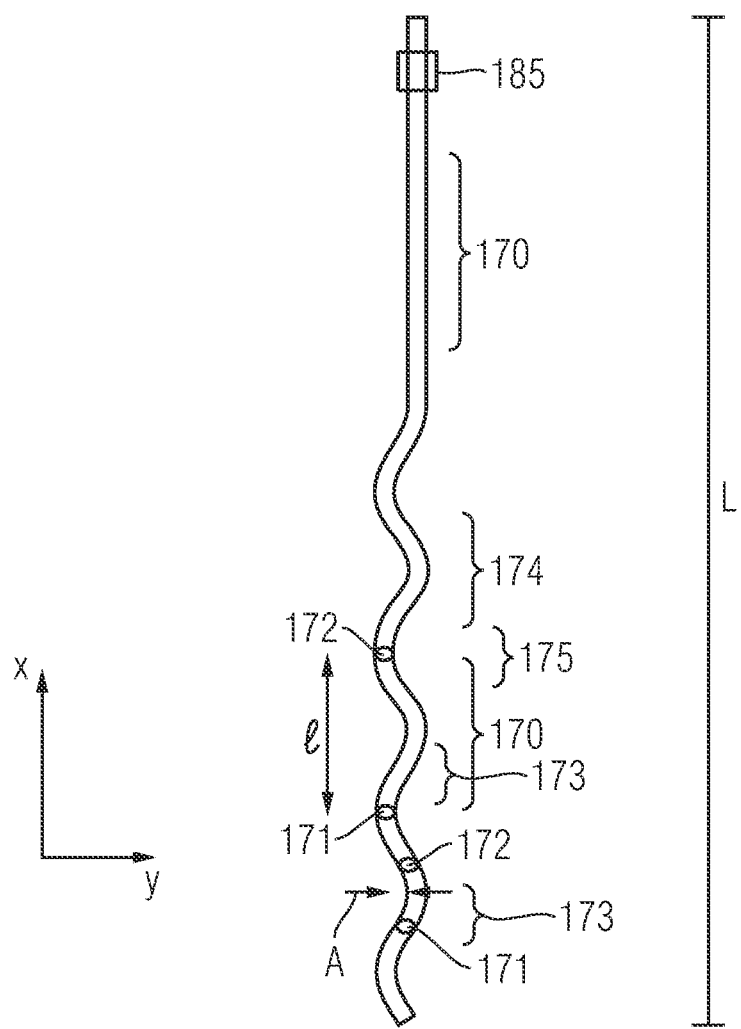
FIG. 3 illustrates elements of a trench structure according to an embodiment.

FIG. 3 shows details of a trench structure 150 according to embodiments. As described herein above, the trench structure 150 comprises a plurality of concatenated trench segments 170. At least one of the trench segments 170 connects a first point 171 and a second point 172 of one trench structure 150. The first point 171 and the second point 172 are arranged along the first linear direction. The trench segment 170 connecting a first point 171 to a second point 172 comprises a portion 173 that extends in a direction different from the first direction. In the embodiment of FIG. 3, the trench segments are undulated or curved. For example, a trench segment 170 may comprise a first trench segment 174 having a positive curvature and a second trench segment 175 having a negative curvature. Further, the first trench segment 174 and the second trench segment 175 may be axis-symmetric to each other with respect to an axis extending along the first linear direction.

According to the embodiment shown in FIG. 3, the trench structure may include a plurality of identical trench segments that form a periodic structure. For example, the periodic structure may have a wavelength L, i.e. a distance between adjacent minima or maxima. Further, the periodic structure may have an amplitude, which may correspond to half the distance between a minimum and a maximum. For example, a minimum wavelength of the periodic structure may be larger than a width of the trench structure According to an embodiment, the amplitude of the undulated periodic trench segment may be d or larger, wherein d represents the distance between adjacent trench structures. According to a further embodiment, A may be larger than 6×d.

In the embodiment of FIG. 3, the trench structure 150 runs into a first direction, for example, the x-direction. "Running into the x-direction" does not necessarily mean that most of the trench segments forming the trench structure run into the x-direction. Rather, this may mean that a straight line connecting a starting point and an end point of the trench structure runs in the first direction. According to a different interpretation, this may mean that a straight line connecting the minima or the maxima of the periodic structure, for example, forming a part of the trench structure extends in the first direction. The trench structure 150 shown in FIG. 3 further may comprise linear, i.e. straight trench segments 170. For example, these linear trench segments 170 may extend in a first direction. Further, contacts, e.g. gate contacts 185 may be disposed so as to contact a portion of the trench structure.

Due to the specific shape of the trench structure, stress within the transistor cell array may be reduced or avoided. By providing portions of segments which extend in a direction different from the first direction, the direction of tensile and compressive stress vectors present within the transistor cell array may be different from the first direction or a direction perpendicular to the first direction. As a result, it becomes possible that the respective stress vectors compensate for each other.

Further, depending on the amounts of tensile stress and compressive stress, an optimum shape of the trench structure and typical parameters e.g. wavelength and amplitude of the periodic structure may be chosen for setting a uniform distribution of tensile and compressive stress.

The shape illustrated in FIG. 3 may be implemented in using a suitable mask for defining the trench structure 150, for example. Accordingly, it becomes possible to implement a semiconductor device in which wafer bow and chip bow due to stress are largely reduced without the need of causing extra complexity of the manufacturing process. In particular, the illustrated trench structure is compatible with the currently used layout including straight trench structures. Due to the reduction of wafer bow, problems during the manufacturing process of the single chips may be avoided and further chip bow may be reduced. Due to the reduction of chip bow, failures of the device may be avoided and the lifetime may be increased. Further, due to the specific orientation of the trench structures, the carrier mobility and thus the conductivity of the device may be increased.

As has been mentioned before, the trench structure 150 may be shaped to have also linear trench segments in which contacts, e.g. may be placed.

Figure 4:
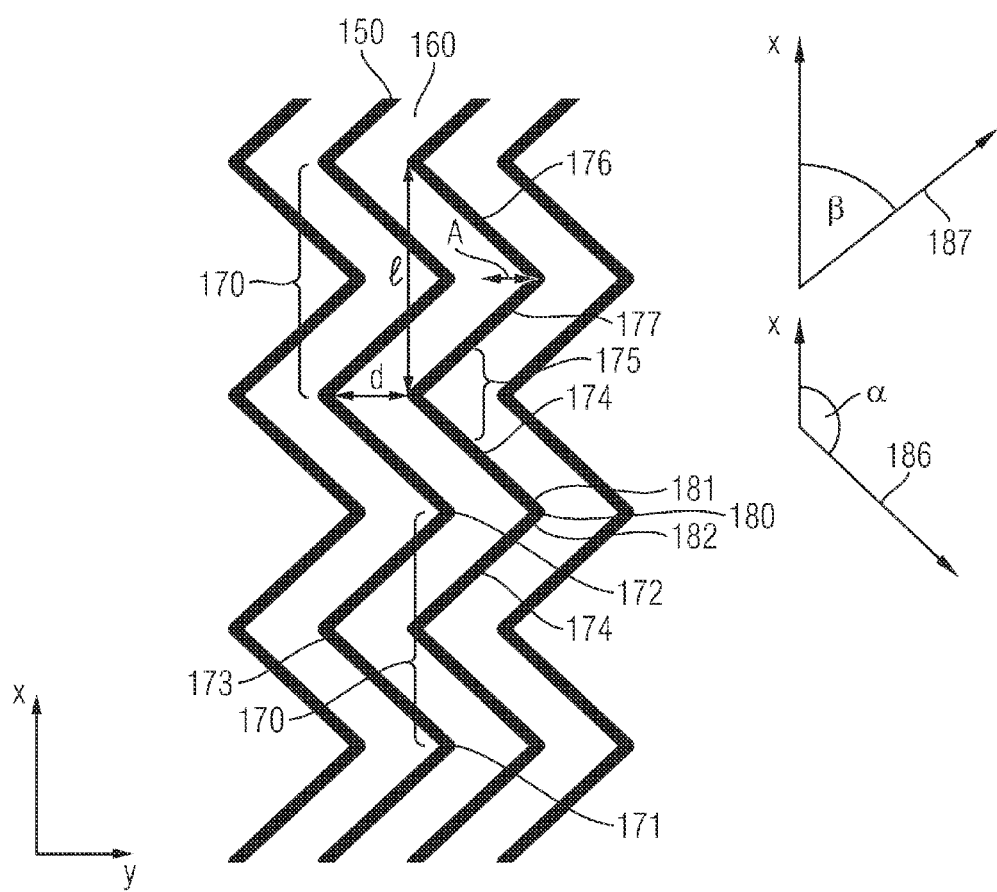
FIG. 4 illustrates portions of a semiconductor device according to a further embodiment.

FIG. 4 illustrates an embodiment according to which the trench segment 170 comprises at least a first and a second linear sub-segment 176, 177. The first linear sub-segments 176 and the second linear sub-segments 177 may be slanted with respect to the first direction, i.e. the x-direction. For example, the first sub-segment 176 may run in a third direction 186, and the second sub-segment 177 may run in a second direction 187, wherein the second direction 187 and the third direction 186 are different from the first direction and are different from each other. For example, an angle between the first direction and the second direction 187 is different from 90°. Further, an angle between the first direction (i.e. the x-direction) and the third direction 186 is different from 90°. For example, an angle between the first direction and the second direction 187 may be 45°, and an angle between first direction and the third direction 186 may be 45°. Further, an angle between the second direction 187 and the third direction 186 may be 90°. According to a further embodiment, an angle between the second direction 187 and the first direction is 180°−α, wherein a denotes an angle between the third direction 187 and the first direction. As is illustrated in the right-hand portion of FIG. 4, the angle α and the angle β correspond to the smallest angle between the second or third direction 186, 187 and the x-direction. According to an embodiment, the first linear sub-segment 176 and the second linear sub-segment 177 may be axis-symmetric to each other with respect to an axis extending perpendicular to the first direction.

According to the embodiment of FIG. 4, the trench segments comprise a first trench segment 174 disposed on a right-hand side of the trench structure and a second trench segment 175 disposed on a left-hand side of the trench structure.

For example, the first trench segment 174 and the second trench segment 175 may be axis-symmetric to each other with respect to an axis that extends along the first linear direction. This situation is comparable to the situation of FIG. 3.

The trench structures 150 shown in FIG. 4 implement a periodic structure in a similar manner as has been explained with respect to FIG. 3. Mesas 160 are disposed between adjacent trench structures 150. The single transistor cells may be implemented in a similar manner as has been explained with reference to FIGS. 2A and 2B. According to the embodiment of FIG. 4, two trench segments 170 may contact at a merging point 180 or contact point, wherein the merging point 180 is disposed at an end 181 of a first trench segment and an end 182 of a second trench segment. According to this implementation, there are not several trench segments, i.e. more than two which contact at a merging point 180. In other words, there is no branching of the trenches but exactly two trench segments are in contact at the merging point 180. Due to this specific structure, an inhomogeneous trench depth may be avoided at points of intersection 180.

The embodiments described may be modified in various manners. For example, linear trench segments, i.e. trench segments which e.g. linearly extend in the first direction may be disposed between adjacent curved or slanted trench segments.

According to the embodiment of FIG. 4, the amplitude of the periodic structure A may be approximately equal to the distance between adjacent trench structures. According to the embodiment of FIG. 4, the slanted sub-segments 176, 177 may be concatenated to form an angled merging point. In more detail, at a merging point 180, the slanted sub-segments intersect each other. Again, due to the specific shape of the trench structures the tensile stress vectors and the compressive stress vectors may compensate each other.

Figure 5:
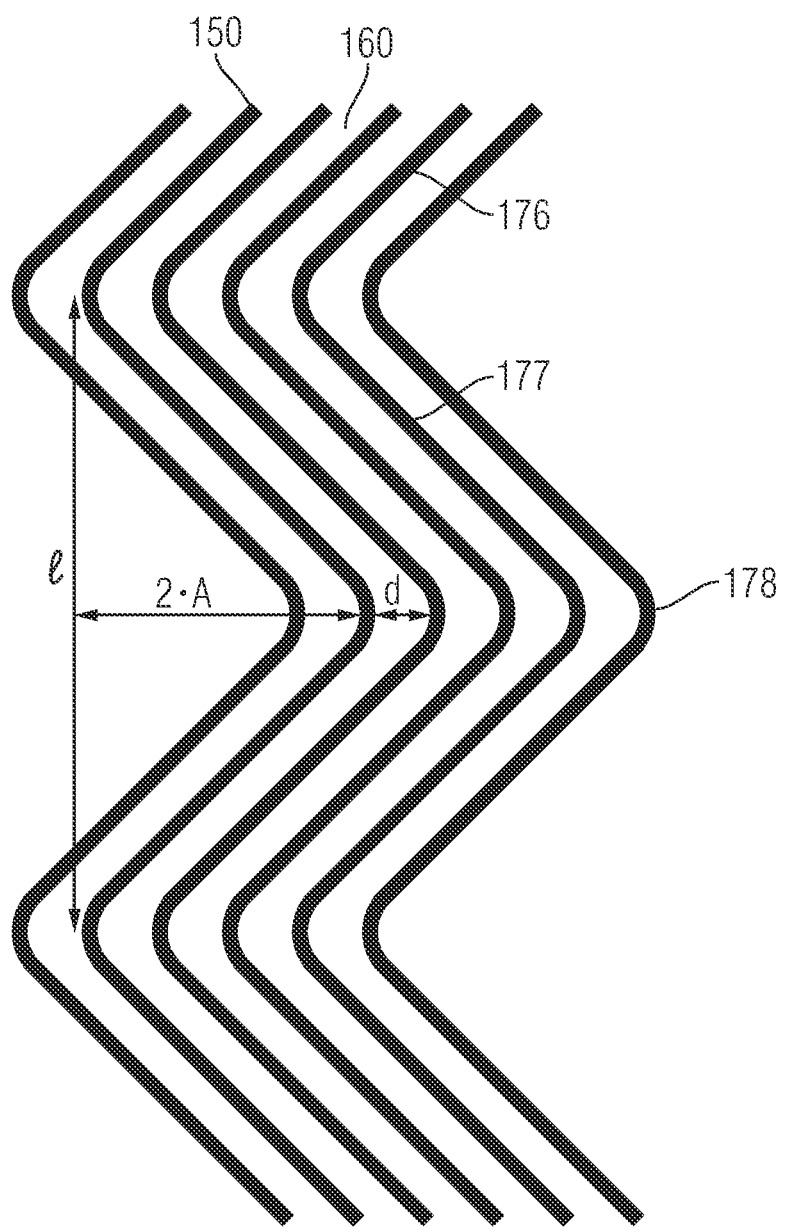
FIG. 5 illustrates a plan view of a further embodiment.

FIG. 5 shows a further modification of this embodiment. As is specifically shown, the trench structure 150 further comprises curved sub-segments 178 connecting linear sub-segments. Thereby, a rounded corner or smooth intersection is formed. According to the embodiment of FIG. 5, the amplitude of the periodic structure may be larger than 3*d, for example, 6 d or even larger.

The semiconductor device 1 as described herein above may be, e.g. a discrete semiconductor device, e.g. field effect transistor (FET) such as a power transistor.

Other than an integrated circuit (IC), which consists of a few to billions of active devices manufactured and interconnected on a single semiconductor body, the discrete semiconductor device is a single transistor in the semiconductor body without any other active semiconductor elements interconnected thereto. Although passive components such as resistors, capacitors and inductors may be formed in and/or on the semiconductor body, the discrete semiconductor device is specified to perform an elementary electronic function. Although the discrete semiconductor device may include a large number of transistor cells, the discrete semiconductor device is specified to perform an elementary electronic function and is not divisible into separate components functional in themselves as is typical for integrated circuits.

Figure 6:
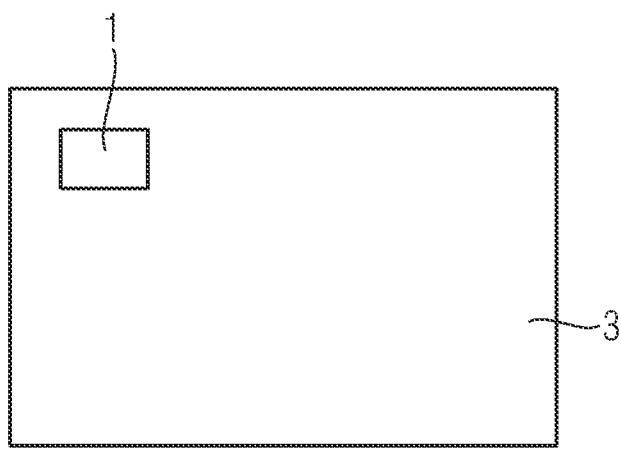
FIG. 6 shows a plan view of an integrated circuit according to an embodiment.

FIG. 6 illustrates a schematic view of an integrated circuit 300 according to an embodiment. According to the embodiment, the integrated circuit 300 may comprise the semiconductor device 1 as described above, further comprising additional analogue circuit(s) and/or digital circuit(s) and/or mixed-signal circuit(s).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising a central portion and an edge termination portion outside the central portion, the central portion comprising a transistor cell array in a semiconductor substrate,
    components of transistor cells of the transistor cell array being disposed in adjacent trench structures in the semiconductor substrate,
    the trench structures running in a first linear direction parallel to a main surface of the semiconductor substrate,
    the trench structures including a plurality of concatenated trench segments in a plane parallel to the main surface in the central portion, at least one of the trench segments connecting a first point and a second point of one trench structure, the first point and the second point being arranged along the first linear direction,
    wherein the at least one trench segment comprises a portion extending in a direction different from the first direction,
    wherein the trench segments are undulated and the undulated trench segments comprise a first trench segment having a positive curvature and a second trench segment having a negative curvature.

2. The semiconductor device according to claim 1,
    wherein the trench structures are disposed parallel to each other having a distance d, the distance d being perpendicular to the first direction,
    an amplitude of the undulated trench segments being d or larger than d.

3. The semiconductor device according to claim 2, wherein an amplitude of the undulated trench segments or angled trench segments is at least 3*d.

4. The semiconductor device according to claim 1,
    wherein the trench segments comprise at least two linear sub-segments, that are assembled to form an angled segment, the first sub-segment running in a third direction, the second sub-segment running in a second direction, the second and third directions being different from the first direction and being different from each other.

5. The semiconductor device according to claim 4,
    wherein an angle between the second direction and the first direction is 180°−α, α denoting an angle between the third direction and the first direction.

6. The semiconductor device according to claim 1,
    wherein a set of concatenated trench segments comprises identical trench segments that form a periodic structure.

7. The semiconductor device according to claim 1,
    wherein the concatenated trench segments comprise a linear trench segment extending in the first direction.

8. The semiconductor device according to claim 1,
    wherein the trench segments comprise a first trench segment disposed on a right hand side of the trench structure and a second trench segment disposed on a left hand side of the trench structure.

9. The semiconductor device according to claim 8, wherein the first trench segment and the second trench segment are axis-symmetric to each other with respect to an axis extending along the first linear direction.

10. The semiconductor device according to claim 1, wherein two trench segments intersect at a merging point, the merging point being disposed at an end of each of the trench segments.

11. The semiconductor device according to claim 1, wherein the trench structures have a depth of at least 4 µm.

12. The semiconductor device according to claim 1, wherein a gate electrode of the transistor cells is disposed within the trench structures.

13. The semiconductor device according to claim 1, wherein an insulating layer or an insulating filling is disposed in a portion of the trench structures, the insulating layer or insulating filling having a thickness of more than 300 nm.

14. The semiconductor device according to claim 1, wherein a number of adjacent trench structures is 500 to 100,000.

15. The semiconductor device according to claim 1, wherein a length of the adjacent trench structures measured in the first direction is greater than 100 µm.

16. The semiconductor device according to claim 1, wherein the semiconductor device is a vertical semiconductor device comprising a first load terminal contact at a first side of the semiconductor substrate and a second load terminal contact at a second side of the semiconductor substrate opposite to the first side, and wherein the semiconductor device is configured to conduct a load current between the first and second load terminal contacts along a vertical direction perpendicular to the main surface.

17. The semiconductor device of claim 1, wherein the semiconductor device is a discrete semiconductor device.

18. An integrated circuit comprising the semiconductor device of claim 1 and further comprising additional circuit elements.

19. A semiconductor device comprising a central portion and an edge termination portion outside the central portion, the central portion comprising a transistor cell array in a semiconductor substrate, components of transistor cells of the transistor cell array being disposed in adjacent trench structures in the semiconductor substrate, the trench structures running in a first linear direction parallel to a main surface of the semiconductor substrate, the trench structures including a plurality of concatenated trench segments in a plane parallel to the main surface in the central portion, at least one of the trench segments connecting a first point and a second point of one trench structure, the first point and the second point being arranged along the first linear direction, wherein the at least one trench segment comprises a portion extending in a direction different from the first direction, wherein a set of concatenated trench segments comprises identical trench segments that form a periodic structure and a gate electrode of the transistor cells is disposed within the trench structures.

20. A semiconductor device comprising a central portion and an edge termination portion outside the central portion, the central portion comprising a transistor cell array in a semiconductor substrate, components of transistor cells of the transistor cell array being disposed in adjacent trench structures in the semiconductor substrate, the trench structures running in a first linear direction parallel to a main surface of the semiconductor substrate, the trench structures including a plurality of concatenated trench segments in a plane parallel to the main surface in the central portion, at least one of the trench segments connecting a first point and a second point of one trench structure, the first point and the second point being arranged along the first linear direction, wherein the at least one trench segment comprises a portion extending in a direction different from the first direction, wherein the trench segments comprise a first trench segment disposed on a right hand side of the trench structure and a second trench segment disposed on a left hand side of the trench structure, wherein the first trench segment is axis-symmetric to the second trench segment with respect to an axis extending along the first linear direction.

* * * * *